United States Patent [19]

Temple

[11] 4,047,219
[45] Sept. 6, 1977

[54] RADIATION SENSITIVE THYRISTOR STRUCTURE WITH ISOLATED DETECTOR

[75] Inventor: Victor A. K. Temple, Elnora, N.Y.

[73] Assignee: General Electric Company, Schenectady, N.Y.

[21] Appl. No.: 628,135

[22] Filed: Nov. 3, 1975

[51] Int. Cl.² .......................................... H01L 29/74
[52] U.S. Cl. ...................................... 357/38; 357/30; 357/55; 357/58; 357/68
[58] Field of Search .................. 357/38, 39, 30, 58, 357/55, 68

[56] References Cited

U.S. PATENT DOCUMENTS

| | | | |
|---|---|---|---|
| 3,535,532 | 10/1970 | Merryman | 357/30 |
| 3,697,833 | 10/1972 | Nakata | 357/38 |
| 3,708,732 | 1/1973 | Faust | 357/30 |
| 3,719,863 | 3/1973 | Ogawa et al. | 357/38 |
| 3,736,180 | 5/1973 | Fischer et al. | 357/30 |
| 3,737,741 | 6/1973 | Bartelink et al. | 357/30 |
| 3,771,029 | 11/1973 | Burtscher et al. | 357/38 |
| 3,858,233 | 12/1974 | Miyata et al. | 357/30 |
| 3,888,697 | 6/1975 | Bogus et al. | 357/30 |
| 3,893,153 | 7/1975 | Page et al. | 357/38 |
| 3,946,423 | 3/1976 | Augustine | 357/30 |

*Primary Examiner*—Michael J. Lynch
*Assistant Examiner*—Joseph E. Clawson, Jr.
*Attorney, Agent, or Firm*—Stephen B. Salai; Joseph T. Cohen; Jerome C. Squillaro

[57] ABSTRACT

A radiation sensitive semiconductor device includes a light sensitive region and an independently selectable gate region isolated therefrom. High sensitivity in combination with large permissible light gathering areas are features.

4 Claims, 4 Drawing Figures

U.S. Patent  Sept. 6, 1977  Sheet 1 of 2  4,047,219
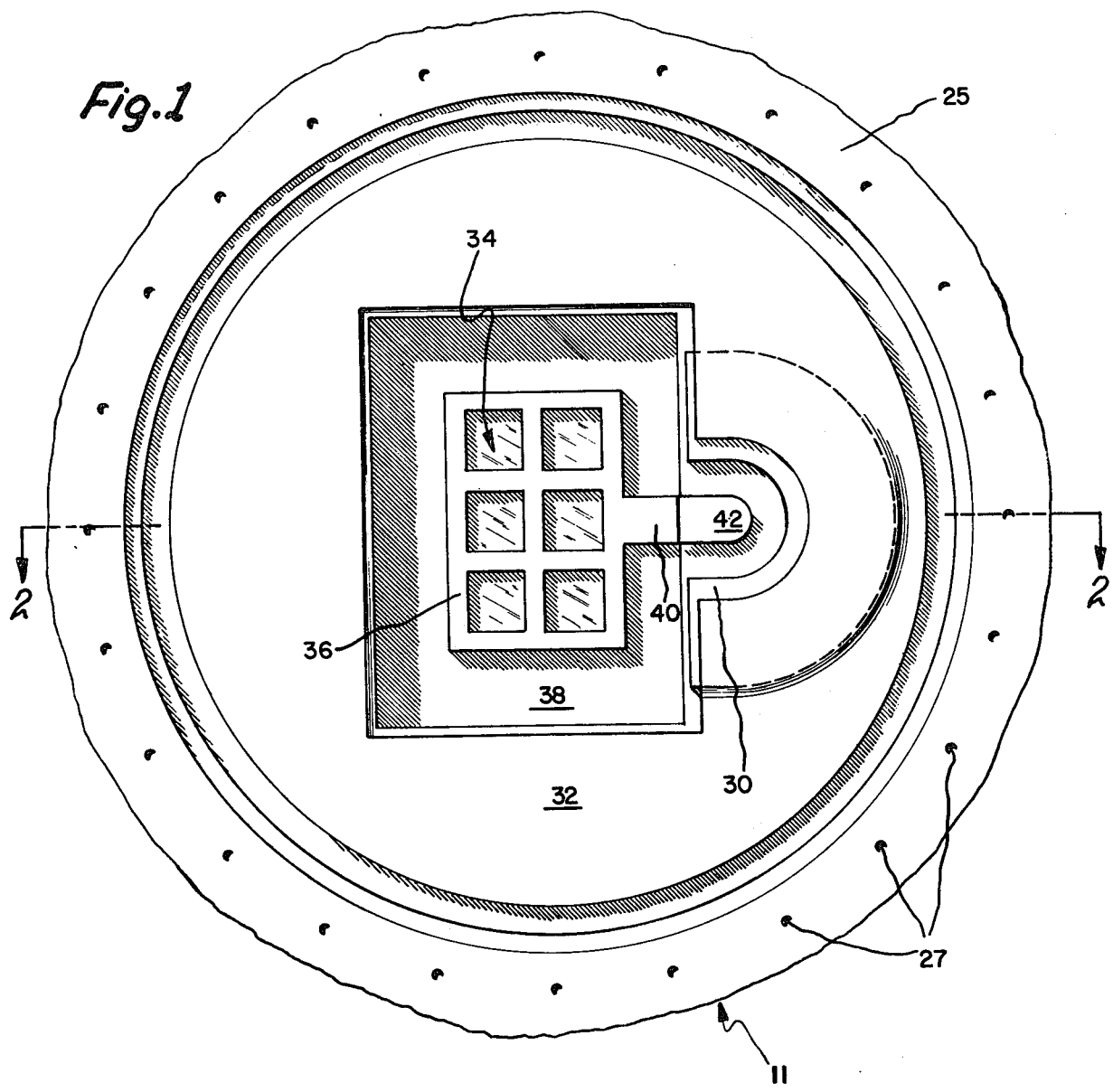
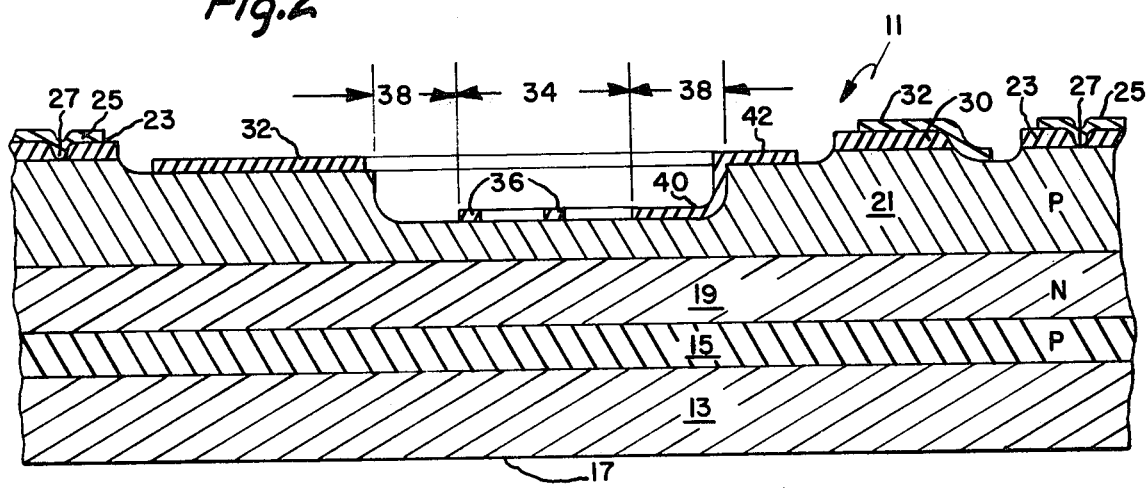

RADIATION SENSITIVE THYRISTOR STRUCTURE WITH ISOLATED DETECTOR

This invention relates, in general, to semiconductor devices, and more particularly to radiation sensitive semiconductor devices. Most particularly, this invention is directed to a light triggered thyristor device.

It has become increasingly important to provide high power (high voltage and high current) thyristor devices. Devices of this type are required in order to provide switching of high voltage, high current electrical circuits. Light triggered devices are desirable in these applications in order to provide a high degree of isolation between the device and the triggering circuit. A number of approaches and devices according thereto have been proposed to achieve sensitive radiation triggered devices. For example, U.S. Pat. No. 3,893,153 to Page et al. for LIGHT ACTIVATED THYRISTOR WITH HIGH DI/DT CAPABILITY. Page et al. provide a thyristor including a light sensitive region and an amplifying gate thyristor structure in order to achieve high sensitivity. It will be appreciated, however, that the structure of Page et al. is limited in the sensitivity which may be obtained. As is well known, the sensitivity of the gate region of a thyristor device is related to the geometry thereof and in a device of the type described by Page et al. increasing the size of the light gathering area of the device necessarily decreases the sensitivity of the gate region thereof. In order to successfully trigger high power devices therefore, others have suggested that focussing be utilized in order to obtain sufficient generation of whole-electron pairs in the light sensitive area. For example, U.S. patent application Ser. No. 555,057 of H. F. Storm for RADIATION TRIGGERED THYRISTOR WITH LIGHT FOCUSSING GUIDE of common assignee herewith teaches a number of structures for providing light focussing on a relatively small light sensitive area in a thyristor including one or more amplifying gates. While optical light focussing provides useful devices, it may in some instances be impractical due to packaging limitations or economic considerations.

It is therefore an object of this invention to provide a radiation sensitive semiconductor device combining high sensitivity with low radiation level triggering requirements.

It is another object of this invention to provide such device without the need for cumbersome or expensive optical light focussing apparatus.

It is yet another object of this invention to provide a thyristor device with electrical focussing of light impinging on a light sensitive area of substantially unconstrained size.

Briefly stated, and in accordance with one aspect of this invention, a radiation triggered semiconductor device is provided having a gate area of preselected design to provide the desired sensitivity and triggering characteristics; and a radiation sensitive area on the device which radiation sensitive area is substantially isolated from the aforementioned gate area. An electrical conductor provides a path for current generated in the radiation sensitive area to the gate of the device. Lateral current flow in the semiconductor portion of the device from the light sensitive area to the gate is therefore substantially eliminated and gate sensitivity is not adversely affected thereby.

The features of the invention which are believed to be novel are pointed out with particularity in the appended claims. The invention itself, however, both as to its organization and method of operation together with further objects and advantages thereof may best be understood by reference to the following description taken in connection with the accompanying drawings in which:

FIG. 1 is a top view of a light sensitive thyristor device in a accordance with one embodiment of this invention.

FIG. 2 is a cross sectional view in elevation in a light activated thyristor taken through line 2—2 of FIG. 1.

Figure 3:
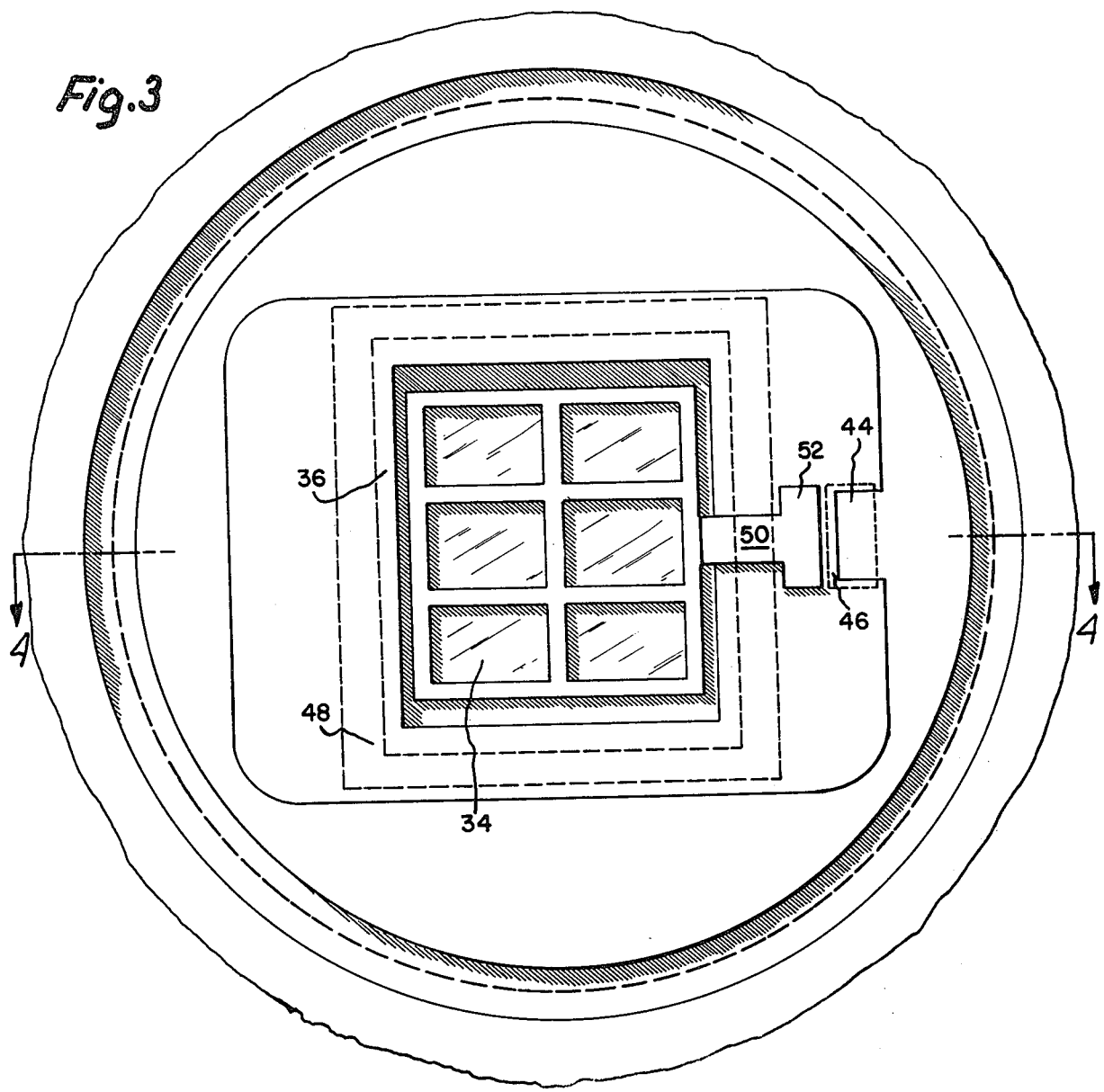
FIG. 3 is a top view of a light sensitive thyristor device in accordance with anaother embodiment of this invention.

FIGS. 1 and 2 are two views of a light triggered four layer semiconductor device in accordance with one embodiment of this invention. FIG. 1 is a top view showing the device generally 11 in both figures. In the discussion to follow, like reference numerals designate like elements of this embodiment of the invention appearing in the several views. Referring first to FIG. 2, thyristor 11 includes an electrode 13 which is the anode contact of the device. Electrode 13 may conveniently be a metal as, for example, tungsten alloyed to anode device layer 15. The methods for making semiconductors of the type with which this invention is concerned are generally well known in the art and form no part of this invention except insofar as the use of such methods or combinations of such methods in the manner hereinbelow described are necessary to provide a device or devices in accordance with the teachings of this disclosure. Similarly, the particular selection of structure included for the purpose of providing an exemplary illustration of this invention, is readily subject to modification by one skilled in the art while remaining within the true spirit and scope of the invention. For example, while a structure is illustrated in FIGS. 1 and 2 which includes a p-type anode region 15 and additional n, p and n-type regions to form a thyristor structure, it will be appreciated that the specific selection of conductivity types in order to provide a thyristor structure of the type with which this invention is concerned may be modified without deviating from the teachings of this invention. For example, specific impurity concentrations, so long as consistent with well known practice in the art are variable over a range of values as will be appreciated by one skilled in the fabrication of semiconductor devices of this type. Where a device in accordance with this invention requires specific application of techniques well known in the art or new techniques peculiar to this invention, it is pointed out clearly hereinbelow. Anode layer 15 may conveniently be of p-type semiconductor material alloyed or otherwise bonded to electrode 13. Similarly, electrode 13 may be provided, if desired, with a contact on surface 17 thereof of gold or other highly conductive material. N-conductivity type layer 19 adjoins p-conductivity type anode layer 15 forming a junction in the region therebetween. N-type layer 19 may conveniently be referred to as the n-base layer of the device and the junction between n-base layer 19 and anode layer 15, the n-base-anode junction. Adjacent n-base layer 19 and opposite anode layer 15 is p-base layer 21. Emitter layers 23 and 30 overlie p-base layer 21. In this exemplary embodiment of the invention, emitter layers 23 and 30 are n-conductivity type. It is to be understood that in accordance with this invention and as was hereinabove mentioned, layers 15, 19, 21, 23 and 30 may be of impurity concentration selected to accomplish the particular purpose to which the thyristor device is to be applied. Further, the conductivity type of each layer might readily be reversed if desired in order to obtain a device substantially complementary to the device illustrated in FIGS. 1 and 2. Emitter electrode 25 overlies n-conductivity type emitter region 23 for providing electrical contact thereto. It may be readily observed by reference to FIG. 1 that the n-type emitter region 23 illustrated as occurring in two locations in FIG. 2 of viz on the left and right hand portions of the figure is, in fact, a single continuous region having the center portion thereof removed. It is conventional in accordance with the art to construct thyristor devices in generally circular form which form is illustrated in accordance with this invention. It will be understood that this invention does not depend on a particular form of thyristor geometry except as will be hereinbelow described, and therefore the particular shape of the thyristor wafer may be varied from that illustrated in FIGS. 1 and 2. Emitter layer 23 is provided with a plurality of shorts extending therethrough which permit contact between emitter electrode 25 and p-base layer 21. These shorts are conventional and are provided in this exemplary embodiment of the invention in accordance with the current state of the art. The thyristor device thus far described is substantially conventional and may readily be constructed in accordance with well known techniques. For example, emitter shorts 27 are illustrated in FIGS. 1 and 2. These shorts extend through n-conductivity type emitter layer 23 and contact p-base layer 21. A plurality of shorts are provided, reference numerals being associated with illustrative shorts only so as not to unduly complicate the drawing. It is to be understood that in accordance with principles well known to those skilled in the art, that a large number of emitter shorts would be provided as desired.

FIGS. 1 and 2 illustrate an embodiment of this invention as would be applied to an amplifying gate thyristor structure. Metallization 32 overlies emitter region 30 of the pilot thyristor portion of the structure and also contacts p-base layer 21. The portion of metallization 32 which is proximate to emitter layer 23 of the main thyristor portion of the structure forms the gate electrode of the main thyristor. The gate region of the pilot thyristor includes electrode 42 and that portion of the p-base regions proximate to emitter layer 30. Emitter layer 30 is of n-conductivity type semiconductor material and overlies p-base layer 21 and forms the emitter of the pilot thyristor. The gate structure of the pilot SCR illustrated in this embodiment of the invention is in the form of a semicircular region. The sensitivity of a semicircular gate region is proportional to twice the natural logarithm of the outer radius divided by the inner radius of the region. It will be appreciated therefore that in order to achieve maximum sensitivity, it is desirable to provide a gate region having a shape such that the inner radium is much smaller than the outer radius If the actual area of the gate region is to be minimized, it is necessary to provide a rather small inner radius. In accordance with this invention, emitter region 30 may take a shape not limited by the inclusion of a light sensitive area within it. The sensitivity of the gate region is therefore limited not by the requirement for a large light sensitive area, but rather by those considerations which would govern the fabrication of a directly triggered, that is to say, non-light triggered device. Where desired, emitter region 30 may be provided with shorts of the type illustrated in conjunction with emitter layer 23. These shorts are optional and therefore not illustrated at FIGS. 1 and 2. Referring especially to FIG. 1, it will be seen that gate electrode 32 may readily be formed as is well known to those skilled in the art by depositing metal on the surface of the device where desired. The boundaries of electrodes 25, 32 and the other electrodes hereinabove described may quite readily be provided by etching away the undesired metal areas. Electrode 32 has a large opening at the interior thereof. The opening is shown at FIGS. 1 and 2 as being generally square in shape. It is to be understood that the shape of the opening is not fundamental to the operation of this invention and that, where desired, for particular purposes, the shape may be varied from that illustrated. Radiation sensitive area 34 which is illustrated as a generally rectangular shaped area is provided in an etched down region within the rectangular opening in gate electrode 32. Radiation sensitive area 34 is preferably adapted, by polishing or otherwise, to be activated by the incidence of radiation thereon to form hole-electron pairs thereunder. The formation of hole-electron pairs underlying the radiation sensitive area causes current flow in that area which current is collected by metallized grid 36. Metallized grid 36 may conveniently be formed at the same time as electrodes 25 and 32 are formed and is preferably an open grid type arrangement of electrodes adapted to permit radiation, and particularly light, to pass through the grid onto radiation sensitive area 34. The particular pattern of electrodes shown in FIGS. 1 and 2 is exemplary and the actual pattern of electrodes might be varied therefrom or omitted, if desired. Isolation region 38 surrounds radiation sensitive area 34 to substantially prevent the lateral flow of current generated in radiation sensitive region 34. Isolation region 38 is formed in this embodiment of the invention by removing a portion of p-base layer 21 surrounding radiation sensitive region 34. This removal may conveniently be done by etching away the undesired thickness of p-base layer 21. This etching may readily be accomplished at the same time as the formation of radiation sensitive region 34. It is emphasized that isolation region 38, shown in this embodiment of the invention as an etched down region, need not necessarily be formed in that manner. It is necessary in accordance with this invention only that a region be provided which limits the lateral flow of current from radiation sensitive region 34. As will be illustrated in accordance with another embodiment of this invention hereinbelow described, a guard ring type structure surrounding radiation sensitive region 34 might readily be employed. Still further in accordance with this invention, isolation may readily be provided by providing a region surrounding radiation sensitive region 34 of lower impurity concentration than the remainder of p-base layer 21.

Metallized grid 36 is connected to electrode 40. Electrode 40 provides a path for current collected by metallized grid 36 through isolation region 38 to the gate region of the pilot thyristor in the amplifying gate structure. While electrode 40 is shown as deposited on the surface of the semiconductor structure, it will be appreciated that in accordance with this invention, any means for conducting the current collected by metallized grid 36 to gate electrode 42 may readily be employed. For example, a piece of wire could readily be utilized although, as will be appreciated by one skilled in the art, the use of a metallized electrode as illustrated at FIGS. 1 and 2 is to be preferred.

It will be appreciated by those skilled in the art that various changes might readily be made to the structure illustrated at FIGS. 1 and 2 without departing from the true spirit and scope of the invention. For example, the precise structure of light sensitive region 34 and isolating region 38 is subject to being modified to achieve particular device characteristics. For example, while light sensitive region 34 is illustrated in FIGS. 1 and 2 as occupying a portion of a large etched down area in p-base region 21, isolation region 38 might equally well be somewhat higher or lower than light sensitive region 34. The precise design of light sensitive region 34 could be varied, for example, in order to accommodate a variety of light sources. Isolation region 38 on the other hand is formed so as to provide isolation between light sensitive region 34 and gate region 42. It is desirable in accordance with this invention that the resistance of p-base layer 21 underlying isolation region 38 be greater than five times the resistance underlying gate electrode 42. It is preferred in accordance with this invention that the ratio of resistances be approximately 10 or more in order to achieve optimum operating characteristics. It will be understood, however, that improved operating characteristics over prior art devices will be obtained with even lower resistance ratios. Where increased resistance in the isolation region is achieved by etching away p-base material, it is important in accordance with this invention to insure that the etch does not substantially enter the depleted region near the p-base-n-base junction so that breakdown voltage is not substantially changed.

Figure 4:
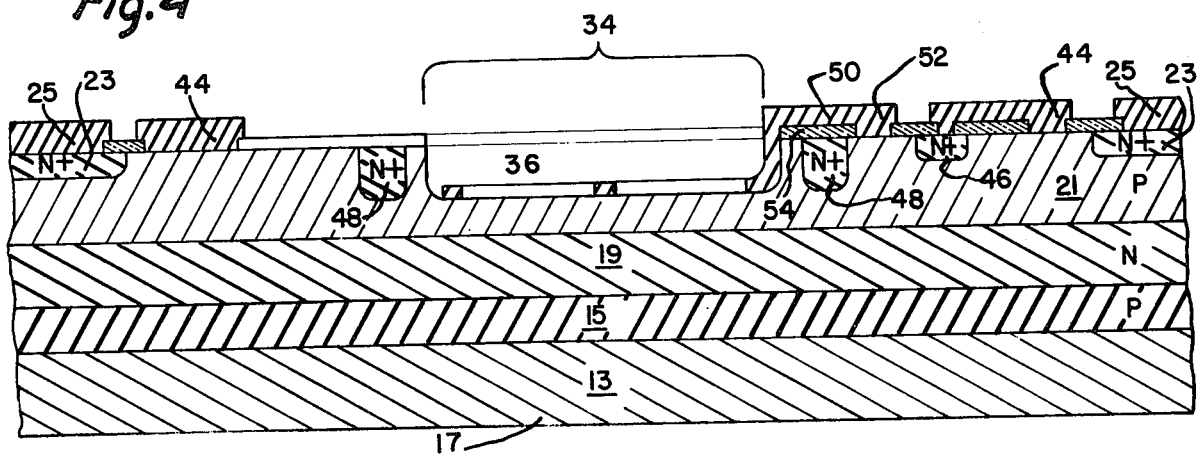
FIG. 4 is a cross-sectional view in elevation in a light activated thyristor taken through lines 3—3 of FIG. 1.

FIGS. 3 and 4 illustrate in top view and in elevation respectively, another embodiment of this invention. The embodiment of this invention illustrated in FIGS. 3 and 4 is substantially similar to the embodiment previously described in conjunction with FIGS. 1 and 2 in several significant respects. For example, both embodiments include a main thyristor section and a pilot thyristor section, the main thyristor section being substantially identical in the two embodiments. Consistent with the similarities between the two embodiments like reference numerals designate like elements in the several figures. The main differences in the two structures occur in the particular structure of the light sensitive area and the isolating region along with the gate structure of the pilot SCR. The particular structural features of the embodiments of this invention illustrated at FIGS. 1 through 4 may be combined in full or in part as desired in accordance with this invention. For example, the gate structure hereinbelow described in conjunction with FIGS. 3 and 4 may be utilized in conjunction with the isolation region structure of FIGS. 1 and 2.

Referring specifically to FIGS. 3 and 4, electrode 13, anode layer 15, n-base layer 19, p-base layer 21, emitter region 23 and emitter electrode 25 correspond substantially to the like numbered elements of FIGS. 1 and 2. It will be appreciated that emitter shorts 27 are not illustrated in FIG. 3 and 4 since, as was hereinabove discussed, they are optional elements in accordance with this invention. As will be most readily appreciated by referring specifically to FIG. 3, the gate structure of the main SCR portion of this embodiment of the invention is a rectangular gate structure. Electrode 44 overlies emitter region 46 which is the emitter of the pilot thyristor portion of the device. Electrode 44 also contacts p-base layer 21 to form the gate region of the main thyristor portion of the invention. The sensitivity of a rectangular gate thyristor structure in accordance with this embodiment of the invention is proportional to the length of the gate region divided by width. It is desirable, therefore, that the width of the gate region be kept as small as possible in order to achieve high sensitivity. Radiation sensitive region 34 is substantially identical to the similarly referenced region of FIGS. 1 and 2. A metallized grid 36 functions to collect current generated by the incidence of radiation on region 34 due to the formation of hole-electron pairs therein. N-type conductivity region 48 surrounds radiation sensitive region 34 to prevent the lateral flow of current therefrom. Region 48 may conveniently be formed by any of the well known methods for forming regions of one conductivity type within regions of the opposite conductivity type, as for example, but not limited to, diffusion, ion implantation, epitaxial growth or the like. Diffusion is preferred in accordance with this embodiment of the invention since it allows for precise control of the depth and extent of region 48. Electrode 50 conducts current collected by metallized grid 36 past impurity region 48 to the gate region of the pilot thyristor. The gate region of the pilot thyristor may conveniently be considered as the end 52 of electrode 50, the proximate region of p-base layer 21.

The semiconductor structure hereinabove described in conjunction with FIGS. 1 and 2 is of the type conveniently fabricated utilizing etch defined plane diffusion techniques. The structure illustrated in FIGS. 3 and 4 is readily fabricated utilizing selective planar diffusion techniques. During the selective planar diffusion process oxide regions are formed and where necessary removed in order to provide diffusion masking. The embodiment of this invention illustrated in FIG. 4 utilizes certain of the oxide layers formed during the processing of the device. For example, oxide layer 54 underlying electrode 50 insulates electrode 50 from n-conductivity type isolation region 48. This insulation may be desirable insofar as it prevents injection of carriers into n-conductivity type isolation region 48 due to the incidental biasing of that region which might result from electrode 50 contacting region 48 at the surface thereof. It will be appreciated that such injection may or may not occur depending upon the particular operating conditions of the device and further that oxide layer 54 may therefore conveniently be removed before the application of metallized electrodes to the device thereby providing a structure substantially free from oxide layers beneath the electrodes.

As was the case in the description of FIGS. 1 and 2, it is preferable in accordance with this invention that n-conductivity type isolation region 48 not extend into the depleted region of the p-base-n-base junction. This limitation on the extent of isolation region 48 applies as well to the extent of the etch associated with radiation sensitive region 34. Consistent with these limitations, however, it is desirable to provide lateral resistivity ratios beneath isolation 48 which are on the order of five to 10 times those in p-base layer 21. As was hereinabove described, however, it will be appreciated that any increase in p-base resistance surrounding the radiation sensitive portion of this device will provide improved operating characteristics over prior art devices, and, therefore, that the resistance ratios hereinabove set forth are the preferred ratios only and are not intended to limit the scope of the invention.

While two embodiments of this invention have been illustrated and described including pilot thyristors (amplifying gate structures), it is to be understood that this invention does not require the use of a thyristor structure including an amplifying gate and, therefore, may readily be practiced in accordance with the teachings hereof utilizing only a single gate structure. For example, referring to FIG. 2, emitter regions 30 could be extended under metallization 32 and also joined with emitter region 23 to form a single emitter region. Likewise, metallization 32 would be joined with metallizations 30 and 35 to form a single emitter metallization.

A thyristor in accordance with this invention may include a light sensitive region at any selected location on a thyristor wafer. For example, a light sensitive region at the edge of the device is feasible and, in fact, desirable in certain applications in order to provide more readily accomplished light triggering. Where the light sensitive area is located at the edge of the device, the isolation region need not fully surround the light sensitive area but merely isolate the remainder of the thyristor therefrom. For example, where the light sensitive area is substantially a semicircle located at the edge of the device, the isolation region also has a semicircular shape. The gate of the device may be located either centrally or near the light sensitive area the current therefrom being conducted by a metallization as taught hereinabove or by a wire, if desired.

While the invention has been particularly shown and described with reference to several preferred embodiments thereof, it will be understood by those skilled in the art that various changes in form and detail may be made therein without departing from the true spirit and scope of the invention as defined by the appended claims.

What is claimed is:
1. A radiation sensitive semiconductor device comprising:
   a semiconductor substrate;
   a radiation sensitive region on said substrate operative to generate an electrical current in response to the incidence of radiation thereon;
   a gate region responsive to the flow of current therein to turn on said semiconductor device;
   an isolating region interposed between said radiation sensitive region and said region for increasing the lateral resistance of said substrate layer between said radiation sensitive region and said gate region to a value greater than the lateral resistance of the remainder of said substrate, said isolating region further characterized by a region of locally higher base resistance than the remainder of said substrate surrounding said radiation sensitive region and by a lower impurity concentration than the remainder of said substrate layer; and
   means for coupling said electrical current from said radiation sensitive region to said gate region for turning on said device in response to the incidence of radiation on said radiation sensitive region.
2. The radiation sensitive device of claim 1 wherein said region of locally higher base resistance includes a region of relatively thin semiconductor material surrounding said radiation sensitive region compared to the remainder of said semiconductor substrate.
3. The radiation sensitive device of claim 2 wherein said region of relatively thin semiconductor material comprises an etched down semiconductor region.
4. The radiation sensitive device of claim 1 wherein said means for coupling current from said radiation sensitive region comprises grid means overlying said radiation sensitive region, and electrode means coupling said grid means to said gate region.

* * * * *